United States Patent
Shiobara et al.

(10) Patent No.: US 8,877,849 B2
(45) Date of Patent: Nov. 4, 2014

(54) THERMOSETTING SILICONE RESIN COMPOSITION FOR REFLECTOR OF LED, REFLECTOR FOR LED USING THE SAME AND OPTICAL SEMICONDUCTOR APPARATUS

(71) Applicant: Shin-Etsu Chemical Co., Ltd., Tokyo (JP)

(72) Inventors: Toshio Shiobara, Annaka (JP); Tsutomu Kashiwagi, Annaka (JP); Takayuki Kusunoki, Annaka (JP); Yoshihiro Tsutsumi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/853,368

(22) Filed: Mar. 29, 2013

(65) Prior Publication Data
US 2013/0271999 A1   Oct. 17, 2013

(30) Foreign Application Priority Data
Apr. 16, 2012   (JP) .................. 2012-093255

(51) Int. Cl.
| | | |
|---|---|---|
| C08K 3/22 | (2006.01) | |
| F21S 8/10 | (2006.01) | |
| C08L 83/04 | (2006.01) | |
| H01L 23/00 | (2006.01) | |
| F21V 7/22 | (2006.01) | |
| H01L 33/60 | (2010.01) | |
| F21Y 101/02 | (2006.01) | |
| H01L 33/48 | (2010.01) | |

(52) U.S. Cl.
CPC ............... *F21V 7/22* (2013.01); *H01L 2224/97* (2013.01); *H01L 2224/73265* (2013.01); *H01L 2224/48091* (2013.01); *H01L 33/60* (2013.01); *F21S 48/215* (2013.01); *C08L 83/04* (2013.01); *F21Y 2101/02* (2013.01); *H01L 24/97* (2013.01); *H01L 33/486* (2013.01); *F21S 48/238* (2013.01); *H01L 2224/45144* (2013.01)
USPC ........... 524/430; 524/413; 524/423; 524/424; 524/432; 524/436; 524/437; 524/456; 524/492; 524/493; 524/497

(58) Field of Classification Search
USPC ......... 524/413, 423, 424, 430, 432, 436, 437, 524/456, 492, 493, 497
See application file for complete search history.

(56) References Cited

U.S. PATENT DOCUMENTS

| | | | |
|---|---|---|---|
| 8,013,057 B2 | 9/2011 | Taguchi et al. | |
| 2007/0042533 A1 | 2/2007 | Endo et al. | |
| 2009/0171013 A1 | 7/2009 | Taguchi et al. | |
| 2009/0258216 A1 | 10/2009 | Yamakawa et al. | |
| 2009/0306263 A1* | 12/2009 | Taguchi et al. ............... | 524/404 |
| 2011/0046319 A1 | 2/2011 | Ueno et al. | |
| 2011/0054072 A1* | 3/2011 | Sawada et al. ................ | 523/353 |

FOREIGN PATENT DOCUMENTS

| | | |
|---|---|---|
| JP | A-2006-140207 | 6/2006 |
| JP | A-2006-156704 | 6/2006 |
| JP | A-2007-235085 | 9/2007 |
| JP | A-2007-297601 | 11/2007 |
| JP | A-2007-329219 | 12/2007 |
| JP | A-2007-329249 | 12/2007 |
| JP | A-2008-189827 | 8/2008 |
| JP | A-2009-21394 | 1/2009 |
| JP | A-2009-155415 | 7/2009 |

OTHER PUBLICATIONS

May 28, 2014 Office Action issued in U.S. Appl. No. 13/853,309.

* cited by examiner

Primary Examiner — Peter Szekely
(74) Attorney, Agent, or Firm — Oliff PLC (57) ABSTRACT

A thermosetting silicone resin composition for an LED reflector has: a thermosetting resin; at least one kind of white pigment selected from titanium oxide, zinc oxide, zirconium oxide, magnesium oxide, barium carbonate, magnesium silicate, zinc sulfate, and barium sulfate; and an inorganic filler other than the pigment, which contains at least one kind of inorganic filler that has an average particle diameter of 30 μm to 100 μm and a refraction index that is different from a refraction index of a cured material of the thermosetting resin by 0.05 or more, and at least one kind of inorganic filler that has an average particle diameter of less than 30 μm. The thermosetting resin composition provides a cured material that has excellent heat and light resisting properties and hardly leaks light, a reflector for an LED obtained by molding using the composition, and an optical semiconductor apparatus using the reflector.

18 Claims, 2 Drawing Sheets

THERMOSETTING SILICONE RESIN COMPOSITION FOR REFLECTOR OF LED, REFLECTOR FOR LED USING THE SAME AND OPTICAL SEMICONDUCTOR APPARATUS

BACKGROUND OF THE INVENTION

1. Field of the Invention

The present invention relates to a thermosetting resin composition used for molding a Reflector for an LED, and a Reflector for an LED and an optical semiconductor apparatus using this composition.

2. Description of the Related Art

An optical semiconductor device such as an LED (Light Emitting Diode) has been used as each of various kinds of indicators or light sources for a street display, an automobile lamp, or a residential illumination. As a reflector for an LED material, a large amount of a thermoplastic resin such as a polyphthalamide resin (PPA) is used. Further, an epoxy resin or the like using acid anhydride as a curing agent has been recently used as a reflector material.

Patent Documents 1 to 5 and 7 to 9 have already disclosed that a thermosetting resin such as a silicone resin or an epoxy resin can be used as the Reflector for LED material. Furthermore, a matrix array type reflector is described in Patent Document 6. In Patent Documents 1 to 3, the epoxy resin or the silicone resin is described, but there is no detailed description about the resin itself.

On the other hand, realization of high luminance of an LED device as a backlight in recent liquid crystal television sets or a general illumination light source has rapidly advanced, a demand for reliability or durability of the LED is rigorous in this application, a thermoplastic resin like a liquid crystal polymer or PPA (polyphthalamide) or a thermosetting resin like an epoxy resin conventionally used as a reflector material is severely degraded in an environment where both heat and light are received at the same time, the resin is discolored, reflectance of light is lowered, and hence there arises a problem that such a resin cannot be used as a reflector.

Fused silica or alumina having high purity has been conventionally well known as a filler of this type of reflector resin composition. In general, the reflector must have a whiteness degree that is as high as possible in order to efficiently reflect light. Since the alumina is a very hard material, at the time of kneading a resin composition, the resin composition is blackened and contaminated by the abrasion between alumina and a kneader. Therefore, when a resin composition highly filled with a hard filler such as alumina alone is used, manufacturing a reflector having high reflectance is very difficult. Moreover, since the alumina having high purity is expensive, there is a problem that using this material as a reflector raises a cost.

Additionally, if a thickness of a wall of a reflector formed by using a thermosetting resin composition is thin, there occurs an inconvenience that light emitted from a light emitting device leaks to the outside.

CITATION LIST

Patent Literature

Patent Document 1: Japanese Patent Laid-Open Publication No. 2006-156704
Patent Document 2: J Japanese Patent Laid-Open Publication No. 2007-329219
Patent Document 3: Japanese Patent Laid-Open Publication No. 2007-329249
Patent Document 4: Japanese Patent Laid-Open Publication No. 2008-189827
Patent Document 5: Japanese Patent Laid-Open Publication No. 2006-140207
Patent Document 6: Japanese Patent Laid-Open Publication No. 2007-235085
Patent Document 7: Japanese Patent Laid-Open Publication No. 2007-297601
Patent Document 8: Japanese Patent Laid-Open Publication No. 2009-21394
Patent Document 9: Japanese Patent Laid-Open Publication No. 2009-155415

SUMMARY OF THE INVENTION

In view of the above-described problem, it is an object of the present invention to provide a thermosetting resin composition that provides a cured material which has excellent heat resisting and light resisting properties and hardly leaks light to the outside, a reflector for an LED molded by using the composition, and an optical semiconductor apparatus using the Reflector for LED.

To solve the above-described problem, according to the present invention, there is provided a thermosetting silicone resin composition for a reflector for an LED, comprising:

(A) 100 parts by mass of a thermosetting resin;

(B) 3 to 200 parts by mass of at least one kind of white pigment selected from titanium oxide, zinc oxide, zirconium oxide, magnesium oxide, barium carbonate, magnesium silicate, zinc sulfate, and barium sulfate; and (C) 200 to 1300 parts by mass of an inorganic filler other than the component (B), which contains at least the following component (C-1) and the following component (C-2):

(C-1) 100 to 1000 parts by mass of at least one kind of inorganic filler that has an average particle diameter of 30 μm to 100 μm and a refraction index that is different from a refraction index of a cured material of the thermosetting resin of the component (A) by 0.05 or more; and (C-2) 100 to 800 parts by mass of at least one kind of inorganic filler that has an average particle diameter of less than 30 μm.

Such a thermosetting silicone resin composition for a reflector for an LED becomes a thermosetting resin composition that provides a cured material which has excellent heat resisting and light resisting properties and hardly leaks light to the outside. In particular, it becomes a composition that provides a cured material which is preferable as a matrix array type reflector. That is, a reflector board in which the matrix array type reflector molded by using such a thermosetting resin composition is formed is rarely warped, dicing or the like after mounting and sealing a light emitting device (an LED device) can be easily carried out, and the optical semiconductor apparatus (an LED apparatus) in which a delamination failure of a reflector surface or an device surface and a sealing resin is suppressed can be obtained after dicing.

Further, in this case, it is preferable for the thermosetting resin of the component (A) to be any of an epoxy resin, a silicone resin, and an epoxy/silicone hybrid resin.

As described above, although the thermosetting resin of the component (A) is not restricted in particular, but these are typical materials.

Furthermore, it is preferable for the inorganic filler of the component (C-1) to be at least one of cristobalite, aluminosilicate, alumina, and a rare-earth oxide.

When the component (C-1) is one selected from these materials, the thermosetting resin composition that provides a cured material that further hardly leaks light to the outside can be obtained.

Moreover, in this case, it is preferable for at least one of the component (C-1) and the component (C-2) of the component (C) to have a spherical shape.

Although the shape of the inorganic filler as the component (C) has no problem in particular, a spherical shape is preferable in order to reduce high filling or abrasion with a kneader as much as possible, and sphericity of 0.7 to 1.0 is preferable.

Additionally, in this case, it is preferable for the thermosetting silicone resin composition for a reflector for an LED to be cured by condensation reaction or hydrosilylation reaction.

In this manner, as the thermosetting resin according to the present invention, there is, e.g., a type that is cured by the condensation reaction or a type that is cured by the addition reaction of an alkenyl group containing silicone resin and a hydrosilyl group containing silicone resin.

Further, according to the present invention, there is provided a reflector for an LED which is obtained by molding using the thermosetting silicone resin composition for the reflector of LED.

The Reflector for LED obtained by molding using the thermosetting resin composition according to the present invention is superior in heat resisting and light resisting properties and hardly leaks light to the outside.

Furthermore, a reflector board in which a matrix type recessed reflector obtained by molding using the thermosetting resin composition is formed has less board warpage.

Moreover, according to the present invention, there is provided an optical semiconductor apparatus using the Reflector for LED of the present invention.

The optical semiconductor apparatus using the Reflector for LED is an optical semiconductor apparatus in which a delamination failure of a reflector surface or a device surface and a sealing resin is suppressed.

The thermosetting resin composition according to the present invention is a thermosetting resin composition that has excellent heat resisting and light resisting properties, hardly leaks light to the outside, and provides a cured material that is particularly preferable as the matrix array reflector.

In particular, since the reflector board in which the matrix array type reflector obtained by molding using such a thermosetting resin composition is formed has less board warpage, dicing or the like after mounting and sealing the light emitting device can be easily carried out, and an optical semiconductor apparatus (an LED apparatus) in which a delamination failure of the reflector surface or the device surface and the sealing resin is suppressed can be obtained after the dicing.

DETAILED DESCRIPTION OF THE PREFERRED EMBODIMENTS

The present invention will now be described hereinafter in detail.

As described above, there has been demanded a reflector material that is used for forming a reflector for an LED that can provide a cured material which has excellent heat resisting and light resisting properties and hardly leaks light to the outside.

As a result of voluntarily repeating examination for achieving the object, the present inventors have revealed that, if a refraction index of a cured material of a curing resin constituting a thermosetting resin composition that is used for forming a reflector for an LED is close to a refraction index of a filler, light emitting from an LED device accommodated in the reflector is apt to leak to the outside. On the other hand, they have also discovered that, if a matrix array type reflector molded on a single side alone is manufactured and used, 200 to 1300 parts by mass of an inorganic filler must be used for filling with respect to 100 parts by mass of the thermosetting resin in order to improve warpage of a molded article.

In general, it is widely known that high filling can be realized by using a filler having a particle diameter of 50 μm or above or more preferably approximately 100 μm for filling in a sealing resin composition of a semiconductor. However, it has been revealed that, when a filler that can realize high filling is used for filling as a recessed type reflector material that accommodates an LED device, there is a filler having a particle diameter of approximately 100 μm in case of a wall thickness of approximately 200 μm, so that light readily leaks to the outside if a refraction index of the filler is close to that of the resin.

Based on the above knowledge, the present inventors have discovered that a thermosetting resin composition using an inorganic filler that has the following two types of particle size distributions in order to avoid light leakage as a reflector for an LED material can serve as a thermosetting resin composition for molding a reflector for an LED that can provide a cured material which has excellent heat resisting and light resisting properties and hardly leaks light to the outside.

That is, the present inventors have found that the thermosetting silicone resin composition for a reflector for an LED is useful as a reflector material of LED, the thermosetting silicone resin composition for a reflector of an LED, comprising:

(A) 100 parts by mass of a thermosetting resin;

(B) 3 to 200 parts by mass of at least one kind of white pigment selected from titanium oxide, zinc oxide, zirconium oxide, magnesium oxide, barium carbonate, magnesium silicate, zinc sulfate, and barium sulfate; and (C) 200 to 1300 parts by mass of an inorganic filler other than the component (B), which contains at least the following component (C-1) and the following component (C-2):

(C-1) 100 to 1000 parts by mass of at least one kind of inorganic filler that has an average particle diameter of 30 μm to 100 μm and a refraction index that is different from a refraction index of a cured material of the thermosetting resin of the component (A) by 0.05 or more; and     (C-2) 100 to 800 parts by mass of at least one kind of inorganic filler that has an average particle diameter of less than 30 μm.

The present invention will now be described hereinafter in detail.

(A) Thermosetting Resin

Although a thermosetting resin as the component (A) in the thermosetting silicone resin composition for a reflector of LED according to the present invention is not restricted in particular, an epoxy resin, a silicone resin, a hybrid consisting of an epoxy resin and a silicone resin (an epoxy/silicone hybrid resin), or the like is typical.

As the epoxy resin, an acid anhydride curing type epoxy resin is generally used. As the epoxy resin, it is possible to use any resin such as an epoxy resin which is of a cresol novolac type, a phenol novolac type, a bisphenol A type, or a biphenyl type or an alicyclic epoxy resin.

Furthermore, as the epoxy resin, a triazine derivative epoxy resin is desirable in terms of heat resisting and light resisting properties. The triazine derivative epoxy resin realizes a semiconductor light emitting apparatus that suppresses yellow discoloration of a cured material of the thermosetting resin composition and is less degraded with time. As this triazine derivative epoxy resin, a 1,3,5-triazine nucleus derivative epoxy resin is preferable. In particular, an epoxy resin having an isocyanurate ring is superior in light resisting properties and electrical insulation properties, and it is preferable for one isocyanurate ring to have a bivalent or preferably trivalent epoxy group. Specifically, it is possible to use tris(2,3-epoxypropyl)isocyanurate, tris(α-methylglycidyl)isocyanurate, tris(α-methylglycydyl)isocyanurate, or the like. It is to be noted that a softening point of the triazine derivative epoxy resin is preferably 90 to 125° C.

Moreover, in the present invention, it is possible to use as a resin component a ground product of a solid product obtained by blending the triazine derivative epoxy resin and an acid anhydride with an epoxy group equivalent/acid anhydride group equivalent of 0.6 to 2.0 and preferably causing reaction in the presence of an oxidation inhibitor and/or a curing catalyst.

The acid anhydride functions as a curing agent, and a non-aromatic type having no double bond is preferable in order to give a light resisting property. For example, there are hexahydro phthalic acid anhydride, methylhexahydro phthalic acid anhydride, trialkyltetrahydro phtalic acid anhydride, hydrogenated methyl nadic acid anhydride, and others. Among them, methylhexahydro phthalic acid anhydride is preferable. In regard to these acid anhydride type curing agents, one kind may be solely used, or two or more types may be used at the same time.

As a blending quantity of the acid anhydride type curing agent, with respect to 1 equivalent of the epoxy group of the triazine derivative epoxy resin, the acid anhydride group equivalent is 0.6 to 2.0, or preferably 1.0 to 2.0, or more preferably 1.2 to 1.6. The equivalent of 0.6 or above is preferable since there is no possibility that a curing failure occurs and reliability is lowered. Additionally, the equivalent of 2.0 or below is preferable since there is no possibility that the unreacted curing agent remains in a cured material, and humidity resisting properties of the resultant cured material are degraded.

Further, as the thermosetting resin that is the component (A) in the thermosetting resin composition according to the present invention, a silicone resin can be exemplified.

As the thermosetting silicone resin, there is one that is cured by condensation reaction or hydrosilylation reaction. The following substances are typical.

(1) Type Cured by Condensation Reaction $$R^1_a Si(OR^2)_b(OH)_c O_{(4-a-b-c)/2} \tag{1}$$

(wherein, $R^1$ is the same or different organic group having 1 to 20 carbon atoms, $R^2$ is the same or different organic group having 1 to 4 carbon atoms, and a, b, and c are numbers that meet $0.8 \leq a \leq 1.5$, $0 \leq b \leq 0.3$, $0.001 \leq c \leq 0.5$, and $0.801 \leq a+b+c<2$.)

(2) Type Cured by, e.g., Platinum-Catalyzed Addition Reaction of (2-1) Alkenyl Group Containing Silicone Resin and (2-2) Hydrosilyl Group Containing Silicone Resin (2-1) Alkenyl Group Containing Silicone Resin (wherein, $R^3$ is each independent substituted or unsubstituted monovalent hydrocarbon group having neither alkenyl group nor aryl group, $R^4$ is an aryl group, $R^5$ is an alkenyl group, and $R^6$ is any of a hydrogen atom, a methyl group, and an ethyl group. d is a number in the range of 0.4 to 1.0, e is a number in the range of 0 to 0.5, f is a number in the range of 0.05 to 0.5, and g is a number in the range of 0 to 0.5, and these numbers meet d+e+f+g=1.0 to 2.0.)

The alkenyl group containing silicone resin represented by the general expression (2) is mainly constituted by organopolysiloxane having a resin structure (i.e., a three-dimensional network structure). It is preferable for the organopolysiloxane having the resin structure to be organopolysiloxane constituted of an $R^8 SiO_{1.5}$ unit, an $R^7_k R^8_p SiO$ unit, and an $R^7_q R^8_r SiO_{0.5}$ unit (in the above formulae, $R^7$ is a vinyl group or an allyl group, $R^8$ is the same group as $R^3$ and $R^4$ described above which is preferably a phenyl group, k is an integer that is 0 or 1 and p is an integer that is 1 or 2 meeting k+p=2, q is an integer in the range of 1 to 3, and r is an integer in the range of 0 to 2 meeting q+r=3).

Assuming that the $R^8 SiO_{1.5}$ unit is a unit T, the $R^7_k R^8_p SiO$ unit is a D unit, and the $R^7_q R^8_r SiO_{0.5}$ unit is an M unit, the organopolysiloxane having the resin structure is preferably formed with an amount achieving (D+M)/T=0.01 to 1 or preferably 0.1 to 0.5 and M/T=0.05 to 3 or preferably 0.1 to 0.5 in terms of molar ratio. Further, the organopolysiloxane whose weight average molecular weight in polystyrene measured by GPO falls in the range of 500 to 10,000 is preferable.

In addition to the T unit, the D unit, and the M unit, the organopolysiloxane having the resin structure may contain a small amount of any other bifunctional siloxane unit, trifunctional siloxane unit, and tetrafunctional siloxane unit.

The organopolysiloxane having the resin structure can be easily synthesized by combining compounds that can be unit sources of the T unit, the D unit, and the M unit so as to achieve the above molar ratio and carrying out, e.g., co-hydrolysis reaction in the presence of an acid.

As the T unit source, it is possible to use, e.g., phenyltrichlorosilane, phenyltrimethoxysilane, phenyltriethoxysilane, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane, methyltriethoxysilane, or the like.

Each of the following materials can be used as the D unit source.

-continued

Each of the following materials can be used as the M unit source.

Further, to achieve appropriate flexibility or low elasticity for a cured material, the following organopolysiloxane can be appropriately blended in addition to the organopolysiloxane.

As such organopolysiloxane that can be blended, there is organopolysiloxane having a linear chain structure in which a main chain is constituted by repeating a diorganosiloxane unit (an $R_2SiO_{2/2}$ unit) and both molecular chain ends are blocked by each triorganosiloxy group (an $R_3SiO_{1/2}$ unit) (in the above formula, R means the same group as $R^3$, $R^4$, or $R^5$).

Among them, linear chain organopolysiloxane that is represented by the following formula (3) and has one or more vinyl groups at each of both ends and viscosity of 10 to 1,000,000 mPa·s or preferably 1,000 to 50,000 mPa·s at 25° C. is desirable in terms of workability, hardenability, and others. The viscosity can be measured by, for example, a rotational viscometer.

The linear chain organopolysiloxane may contain a small amount of a branch structure in its molecular chain.

(3)

In the formula, $R^3$ and $R^4$ represent as described above, and R' is $R^3$ or $R^4$. h represents an integer of 1, 2, or 3.

In the above formula (3), each of x, y, and z is 0 or a positive integer that meets $1 \le x+y+z \le 1,000$, or preferably an integer that meets $5 \le x+y+z \le 500$, or more preferably $30 \le x+y+z \le 500$, and it is an integer also meeting $0.5 < (x+y)/(x+y+z) \le 1.0$.

As organopolysiloxane represented by the formula (3) described above, there are specifically the following materials, wherein x, y, and z represent as described above.

(2-2) Hydrosilyl Group Containing Silicone Resin Organohydrogenpolysiloxane represented by the following general formula (4) and/or the following average composition formula (5), (4)

wherein each $R^9$ independently represents substituted or unsubstituted monovalent hydrocarbon group that does not contain an alkenyl group, $R^{10}$ represents a hydrogen atom, and n represents an integer of 1 to 10.

(5)

In the formula, each $R^{11}$ independently represents substituted or unsubstituted monovalent hydrocarbon that does not contain an alkenyl group and aryl group. $R^{12}$ represents an aryl group, i represents a number in the range of 0.6 to 1.5, j represents a number in the range of 0 to 0.5, k represents a number in the range of 0.4 to 1.0, and these numbers meet i+j+k=1.0 to 2.5.

As such organohydrogenpolysiloxane, there are tris(dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, methylhydrogenpolysiloxane with both ends blocked with trimethylsiloxy group, dimethylsiloxane/methylhydrogensiloxane copolymer with both ends blocked with trimethylsiloxy group, dimethylsiloxane/methylhydrogensiloxane copolymer with both ends blocked with dimethylhydrogensiloxy group, methylhydrogensiloxane/diphenylsiloxane copolymer with both ends blocked with trimethylsiloxy group, methylhydrogensiloxane/diphenylsiloxane/dimethylsiloxane copolymer with both ends blocked with trimethylsiloxy group, copolymer consisting of a $(CH_3)_2HSiO_{1/2}$ unit and an $SiO_{4/2}$ unit, a copolymer consisting of a $(CH_3)_2HSiO_{1/2}$ unit, an $SiO_{4/2}$ unit, and a $(C_6H_5)SiO_{3/2}$ unit, and others.

Further, organohydrogenpolysiloxane represented by the following structure can be also used.

It is desirable for a total equivalent of the hydrosilyl group in the hydrosilyl group containing silicone resin to be 0.5 to 4.0 equivalents, or preferably 0.8 to 2.0 equivalents, or more preferably 0.9 to 1.5 equivalent with respect to 1 equivalent of the alkenyl group in (2-1) the alkenyl group containing silicone resin. If the total equivalent is 0.5 equivalent or above, there is no possibility that the addition reaction does not advance and a cured material cannot be obtained. Furthermore, if the total equivalent is 4.0 equivalents or below, there is no possibility that a large amount of the unreacted hydrosilyl group remains in the cured material and changes physical properties with time, which is preferable.

Moreover, a hybrid resin obtained by mixing the epoxy resin and the silicone resin (an epoxy/silicone hybrid resin) can be also used.

(B) White Pigment

In the thermosetting resin composition according to the present invention, a white pigment selected from titanium oxide, zinc oxide, zirconium oxide, magnesium oxide, barium carbonate, magnesium silicate, zinc sulfate, and barium sulfate is blended as the component (B).

The white pigment is blended as a white coloring agent in order to enhance a whiteness degree, and one kind of the white pigment can be solely used, or several types of the same can be used at the same time. Of these materials, using titanium dioxide is preferable, and a unit lattice of this titanium dioxide may be any of a rutile type, an anatase type, and a brookite type. Furthermore, although an average particle diameter or a shape is not restricted, and an average particle diameter is usually 0.05 to 5.0 µm or preferably 0.1 to 2 µm. It is to be noted that the average particle diameter can be obtained as a mass average value $D_{50}$ (or a median size) in particle size distribution measurement using a laser diffraction method.

In regard to blending amount of the component (B), 3 to 200 parts by mass or preferably 5 to 150 parts by mass are blended with respect to 100 parts by mass of the thermosetting resin component of the component (A). In case of less than 3 parts by mass, the sufficient whiteness degree may not be obtained. Furthermore, in case of exceeding 200 parts by mass, not only a ratio of other components that are added in order to improve mechanical strength is reduced, but also moldability may be considerably lowered in some cases.

(C) Inorganic Filler

The component (C) contained in the thermosetting silicone resin composition for the Reflector for LED according to the present invention is an inorganic filler other than the component (B), which contains the following component (C-1) and the following component (C-2). That is, the component (C) is an inorganic filler having at least two kinds of particle size distributions in order to avoid light leakage.

(C-1) At least one kind of inorganic filler that has an average particle diameter of 30 µm to 100 µm and a refraction index that is different from a refraction index of a cured material of the thermosetting resin of the component (A) by 0.05 or more.

(C-2) An inorganic filler other than the component (C-1) that has an average particle diameter of less than 30 µm.

<Component (C-1)>

As the component (C-1), an inorganic filler that has an average particle diameter of 30 µm to 100 µm and a refraction index that is different from a refraction index (which is measured with use of a D line (a bright-line spectrum) of an Na atom) of the thermosetting resin of the component (A) by 0.05 or more must be used, and this material is selected based on the refraction index of the thermosetting resin to be used.

When the inorganic filler having the refraction index that is different from the refraction index of the cured thermosetting resin of the component (A) by less than 0.05 is used, light easily passes through the cured resin composition, and the light leaks to the outside.

As an average particle diameter, a value of 30 to 70 µm is preferable, or a value of 35 to 60 µm is more preferable. Here, the average particle diameter can be obtained by as a mass average value $D_{50}$ (or a median size) in particle size distribution measurement using a laser diffraction method.

When the thermosetting resin as the component (A) is an epoxy resin, since a refraction index of the cured epoxy resin (a cured resin) is approximately 1.50 to 1.55, alumina, aluminosilicate, zircon, a rare-earth oxide (yttrium oxide, lanthanum oxide), or the like, which have a refraction index of 1.55 or above can be adopted as the component (C-1).

When the thermosetting resin as the component (A) is a silicone resin or a hybrid of an epoxy resin and a silicone resin (an epoxy/silicone hybrid resin), since a refraction index of the cured resin is approximately 1.41 to 1.53, cristobalite, alumina, aluminosilicate, zircon, a rare-earth oxide (yttrium oxide, lanthanum oxide), or the like, which has a refraction index of 1.47 or above can be adopted as the component (C-1).

Although a shape of each of these inorganic fillers has no problem in particular, a spherical shape is particularly desirable in order to realize high filling or reduce abrasion with a kneader as much as possible. As sphericity, a value of 0.7 to 1.0 is preferable.

A filling amount of the component (C-1) is 100 to 1000 parts by mass with respect to 100 parts by mass of the thermosetting resin as the component (A). Moreover, this filling amount realizes a total amount between the later-described component (C-2) as 200 to 130 parts by mass. If an additive amount of the inorganic filler of the component (C-1) is less than 100 parts by mass, an amount of powder in a coarse grain region is too small, and high filling cannot be realized. Additionally, if this amount exceeds 1000 parts by mass, an amount of powder in the coarse grain region is large, viscosity is high, and moldability becomes poor.

<Component (C-2)>

On the other hand, a refraction index of the fine powder inorganic filler as the component (C-2) having an average particle diameter of less than 30 µm is not restricted in particular. A preferable average particle diameter is 0.01 µm to 25 µm, or a more preferable average particle diameter is 1 to 20 µm, and a particularly preferable average particle diameter is 3 to 15 µm.

Although the component (C-2) is not restricted in particular as long as it is an inorganic filler that meets the above average particle diameter, for example, silica or a filler with a small particle diameter (an average particle diameter is less than 30 µm) exemplified in conjunction with the component (C-1) is given as an example, and a filler with a spherical shape is preferable. Since a price of a reflector, contamination due to abrasion with a kneader, an expansion coefficient of the cured resin composition must be reduced as much as possible, fused silica is preferable, and fused silica having a shape is particularly preferable.

A filling amount of the component (C-2) is 100 to 800 parts by mass or preferably 200 to 600 parts by mass with respect to 100 parts by mass of the thermosetting resin of the component (A). If the component (C-2) is less than 100 parts by mass, an amount of powder with a small particle size is too small, fluidity is insufficient at the time of molding such as transfer molding or compression molding, and a reflector may not be possibly manufactured. If the amount of the component (C-2) exceeds 800 parts by mass, the particle size distribution of the powder is biased to a finer distribution, viscosity rises, and the fluidity is lowered.

Additionally, besides the above-described inorganic filler, it is possible to use micronized silica, micronized alumina, silicon nitride, aluminum nitride, boron nitride, antimony trioxide, and a fibrous inorganic filler such as glass fiber or wollastonite.

Other Components

Adhesive Auxiliary Agent

According to the present invention, in addition to the components (A) to (C), in order to improve adhesion with a lead frame or the like, an adhesive auxiliary agent such as a silicone-based adhesive auxiliary agent, a silane coupling agent, or a titanate coupling agent may be compounded.

As the silicone-based adhesive auxiliary agent, a siloxane compound having an organic functional group such as alkoxy group, an epoxy group, and the like in molecules and a siloxane compound having an organic functional group such as a hydrosilyl group (an SiH group), an epoxy group, and the like in molecules is exemplified. As the silane coupling agent, for example, it is preferable to use epoxy functional alkoxysilane such as γ-glycidoxypropyltrimethoxysilane, γ-glycidoxypropylmethyldiethoxysilane, or β-(3,4-epoxy cyclohexyl)ethyltrimethoxysilane, amino functional alkoxysilane such as N-β (aminoethyl)-γ-aminopropyltrimethoxysilane, γ-aminopropyltriethoxysilane, or N-phenyl-γ-aminopropyltrimethoxysilane, or mercapto functional alkoxysilane such as γ-mercaptopropyltrimethoxysilane. It is to be noted that a blending amount of the coupling agent is preferably 0.01 to 10 parts by mass or particularly 0.1 to 5 parts by mass with respect to 100 parts by mass of the component (A).

Various Additive Agents

Various additive agents can be blended into the thermosetting resin composition according to the present invention as required. For example, additive agents such as a reactivity control agent, a releasing agent, and for the purpose of improving properties of the resin, various kinds of a silicone powder, a thermoplastic resin, a thermoplastic elastomer, or an organic synthetic rubber can be added and combined.

Method for Preparing Thermosetting Silicone Resin Composition for Reflector of LED As a method for preparing a thermosetting silicone resin composition for a reflector of LED according to the present invention, for example, (A) a thermosetting resin, (B) a white pigment, (C) an inorganic filler, and any other additive, and others are blended at a predetermined composition ratio, these materials are sufficiently mixed uniformly by using a mixer or the like, then melt mixing processing using a heated roll, a kneader, or an extruder or the like is carried out, subsequently cooling and solidification is performed, and the solidified material is fractured to have an appropriate size, thereby obtaining a thermosetting resin composition.

Reflector for LED

Although the thermosetting resin composition according to the present invention is a thermosetting resin composition used for molding a reflector for an LED, and the most common molding method of the reflector is a transfer molding method or a compression molding method.

According to the transfer molding method, it is preferable to use a transfer molding machine and carry out molding under a molding pressure of 5 to 20 N/mm$^2$ at a molding temperature of 120 to 190° C. for a molding time of 30 to 500 seconds, especially at a molding temperature of 120 to 180° C. for a molding time of 30 to 300 seconds.

According to the compression molding method, it is desirable to use a compression molding machine and carry out molding at a molding temperature of 120 to 190° C. for a molding time of 30 to 600 seconds, especially at a molding temperature of 120 to 180° C. for a molding time of 120 to 420 seconds.

Further, in both the molding methods, post-cure may be performed at 150 to 185° C. for 2 to 20 hours.

Figure 1:
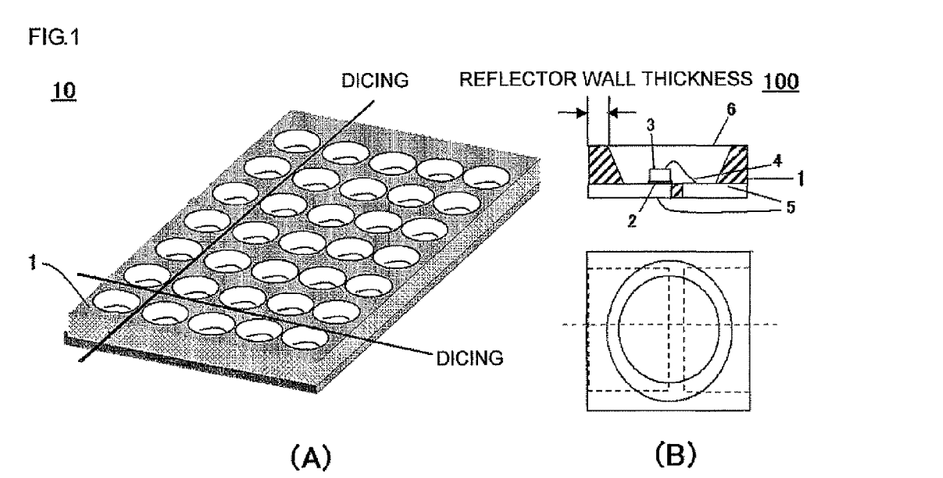
FIG. 1 is a perspective view of a reflector board in which a matrix type recessed reflector molded with use of a thermosetting resin composition according to the present invention is formed, and (B) is a top view and a sectional view of an optical semiconductor apparatus manufactured by using the reflector board.
Figure 2:
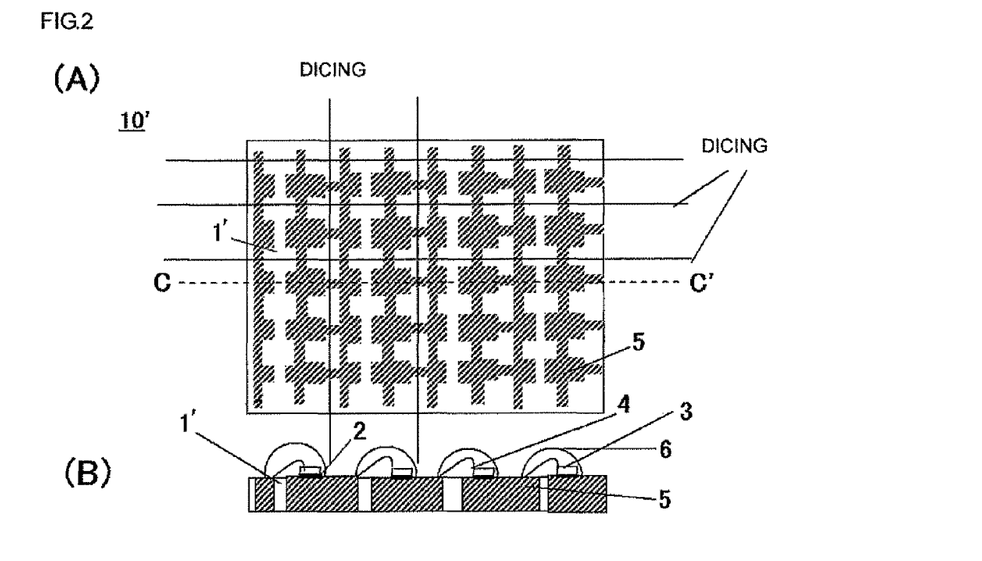
FIG. 2 is a top view of a reflector board in which a matrix type planar reflector molded with use of the thermosetting resin composition according to the present invention is formed, and (B) is a sectional view of the reflector board on which a light emitting device is mounted/sealed.

As shown in FIG. 1(A), it is possible to manufacture a reflector board 10 in which a matrix type recessed reflector 1 molded with use of the thermosetting resin composition according to the present invention is formed. Furthermore, as shown in FIG. 2(A), it is possible to manufacture a reflector board 10' in which a matrix type planar reflector 1' molded with use of the thermosetting resin composition according to the present invention is formed.

Optical Semiconductor Apparatus

An optical semiconductor apparatus can be manufactured with use of the above Reflector for LED.

Specifically, in case of using the reflector board 10 having the matrix type recessed reflector 1 shown in FIG. 1, before cutting the matrix type reflector board 10, a light emitting device 3 (an LED device) is fixed on a die pad 2 present in each recessed portion (an device mount region) of the reflector board 10 by using a silicone die bonding agent (LPS-8445S manufactured by Shin-Etsu Chemical Co., Ltd.), heating is effected at 150° C. for one hour, and each light emitting device 3 is thereby secured. Thereafter, each light emitting device 3 is electrically connected to a lead frame 5 through a gold wire 4. Subsequently, a transparent silicone resin 6 comprising a transparent silicone resin (LPS5547 manufactured by Shin-Etsu Chemical Co., Ltd.) and a fluorescent substance or the like is cast into each recessed portion of the reflector board 10 by potting and heated and cured at 120° C. for one hour and further at 150° C. for two hours, and sealing is carried out. Sealing of the transparent silicone resin 6 can be performed by a method using potting, or this resin can be formed into a lens shape or the like at the same time by using a sealing method such as transfer molding or compression molding.

In case of using the reflector board 10' having the matrix type planar reflector 1' shown in FIG. 2(A), before cutting the reflector board 10', a light emitting device (an LED device) 3 is fixed on each die pad 2 present on the reflector board 10' by using a silicone die bonding agent (LPS-84455 manufactured by Shin-Etsu Chemical Co., Ltd.), heated at 150° C. for one hour, and thereby secured. Thereafter, each light emitting device 3 is electrically connected to a lead frame 5 through a gold wire 4. Subsequently, a transparent silicone resin 6 comprising a transparent silicone resin (LPS-5538 manufactured by Shin-Etsu Chemical Co., Ltd.) and a fluorescent substance, or the like is molded and sealed into a lens shape by transfer molding or compression molding under curing conditions of 120° C. and three minutes, and it is further heated and cured at 150° C. for two hours. FIG. 2(B) shows a C—C' sectional view of the reflector board 10' having each light emitting device 3 mounted and sealed thereon.

Then, the reflector board 10 or 10' on which the light emitting device is mounted and sealed can be cut by dicing, laser machining, or water jet machining and formed into each individual piece or a single piece, whereby the optical semiconductor apparatus can be obtained. FIG. 1(B) shows a top view and a sectional view of an optical semiconductor apparatus 100 obtained by dicing the reflector board 10 having the light emitting device mounted and sealed in each recessed portion.

Figure 3:
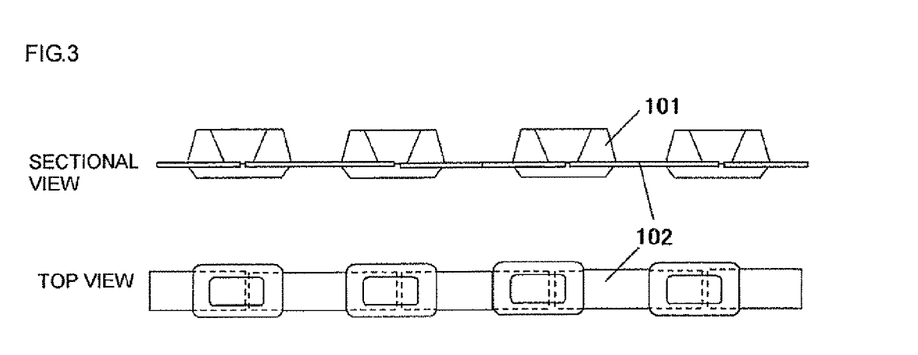
FIG. 3 is a sectional view and a top view of an individual-piece type reflector molded with use of the thermosetting resin composition according to the present invention.

It is to be noted that no problem occurs even if an individual-piece reflector 101 shown in FIG. 3 is molded with use of the thermosetting resin composition according to the present invention. Reference numeral 102 denotes a lead frame.

When the Reflector for LED molded by using the thermosetting resin composition according to the present invention is used, adhesion of the reflector surface and the transparent silicone resin which is the sealing resin stiffens, degradation of the reflector surface due to light is not observed, and hence reliability of the optical semiconductor apparatus (the LED apparatus) can be considerably improved.

EXAMPLES

Examples and comparative examples will now be given, and the present invention will be specifically explained, but the present invention is not restricted to the following examples. It is to be noted that a part in the following description means a part by mass.

Synthesis examples and particulars of starting materials used in examples and comparative examples and shown in the following Tables 1 and 2 will now be given.

Synthesis Example 1

Synthesis of Thermosetting Resin A1 (Epoxy Resin)

45 parts by mass of a triazine derivative epoxy resin (TEPIC-S), 55 parts by mass of acid anhydride (RIKACID MH), 3 parts by mass of an antioxidant (triphenyl phosphite), and a catalyst quantity of an imidazole-based catalyst (2E4MZ) are molten and mixed at 100° C. in a reaction tank in advance, cooled, solidified (a softening point is 60° C.), and then pulverized, thereby obtaining a thermosetting resin A1 (a refraction index of a cured material: 1.54) of the component (A).

It is to be noted that each reactive starting material used in Synthesis Example 1 is as follows.

Triazine Derivative Epoxy Resin
Tris(2,3-epoxypropyl)isocyanate (TEPIC-S: a brand name of Nissan Chemical Industries, Ltd., an epoxy equivalent: 100)

Acid Anhydride
No carbon-carbon double bond anhydride: methylhexahydrophthalic anhydride (RIKACID MH: a brand name of New Japan Chemical Co., Ltd.)

Antioxidant
Phosphorous antioxidant: triphenyl phosphite (a brand name of Wako Junyaku Inc.)

Imidazole-based catalyst: 2-ethyl-4-methylimidazole (2E4MZ: a brand name of Shikoku Chemicals Corporation)

Titanium dioxide: a rutile type (R-45M: a brand name of Sakai Chemical Industry Co., Ltd.)

Synthesis Example 2

Synthesis of Thermosetting Resin A2 (a Silanol Group Containing Silicone Resin)

100 pars by mass of methyltrichlorosilane and 200 parts by mass of toluene were put into a flask of 1 L, and a mixture of 8 parts by mass of water and 60 parts by mass of isopropyl alcohol was dripped into the liquid. Dripping was carried out at an inner temperature of −5 to 0° C. for five to 20 hours, then heating was effected, and stirring was conducted at a reflux temperature for 20 minutes. Thereafter, the liquid was cooled to a room temperature, 12 parts by mass of water were dripped at 30° C. or a lower temperature for 30 minutes, and stirring was effected for 20 minutes. Further, 25 parts by mass of water were dripped, then stirring was performed at 40 to 45° C. for 60 minutes. Subsequently, 200 parts by mass of water were added, and an organic layer was separated. This organic layer was cleaned until it neutralizes, then azeotropic dehydration, filtration, and decompression stripping were carried out, whereby the thermosetting resin A2 which is a transparent and colorless solid substance (a melting point: 76° C.) and corresponds to 36.0 parts by mass was obtained. A refraction index of the cured resin is 1.41.

Furthermore, besides the thermosetting resins A1 and A2, the following alkenyl group containing silicone resin (A3-1 obtained in the following Synthesis Example 3, A3-2 described below) and a hydrosilyl group containing silicone resin (A3-3, A3-4, or A3-5 described below) were used as the thermosetting resin of the component (A).

Synthesis Example 3

Synthesis of Vinyl Group Containing Organopolysiloxane (A3-1)

1000 g of xylene and 5014 g of water were put into a flask, and a mixture of 2285 g of phenyltrichlorosilane (10.8 mol),

326 g of vinyldimethylchlorosilane (2.70 mol), and 1478 g of xylene was dripped. After end of dripping, stirring was performed for three hours, a wasted acid was separated, and washing was performed by water. After azeotropic dehydration, 0.6 g of KOH (0.015 mol) was added, and this liquid was heated to reflux at 150° C. for four hours. Thereafter, the liquid was neutralized with 2.7 g of trimethylchlorosilane (0.025 mol) and 2.5 g of potassium acetate (0.025 mol) and filtered, then a solvent was subjected to vacuum distillation, and a transparent and solid siloxane resin (A3-1) was synthesized at a room temperature. A vinyl equivalent was 0.0013 mol/g, and a hydroxyl group equivalent was 0.01 mass %. A softening point was 65° C.

As vinyl group containing linear organopolysiloxane (A3-2), the following substance was used.

A vinyl group equivalent is 0.0015 mol/g

As organohydrogenpolysiloxane (A3-3), organohydrogenpolysiloxane having the following structure (0.00377 mol/g) was used, (n=2.0 (an average value)), wherein X represents a hydrogen atom, and an SiH group equivalent is 0.403. Ph represents a phenyl group.

As organohydrogenpolysiloxane (A3-4), organohydrogenpolysiloxane having the following structure (0.0069 mol/g) was used.

As organohydrogenpolysiloxane (A3-5), organohydrogenpolysiloxane having the following structure (0.0076 mol/g) was used.

As a white pigment that is the component (B), the following materials were used.
(1) Titanium oxide (CR-95: manufactured by Ishihara Sangyo Kaisha, Ltd., a rutile type average particle diameter: 0.28 μm)
(2) Zinc oxide (Mitsui Mining & Smelting Company Limited)
(3) Magnesium oxide (manufactured by WAKO-Chemicals, an average particle diameter: 10 um)
(4) Barium carbonate (manufactured by WAKO-Chemicals, purity: 99%)
(5) Barium sulfate (manufactured by WAKO-Chemicals)
(6) Magnesium silicate (manufactured by Kishida Chemical Co., Ltd., purity: 90%)

As an inorganic filler that is the component (C), the following materials were used.
(1) Fused spherical silica (S-1): an average particle diameter of 10 μm, a refraction index of 1.43, a specific gravity of 2.2
(2) Fused spherical silica (S-2): an average particle diameter of 55 μm, a refraction index of 1.43, a specific gravity of 2.2
(3) Fused spherical silica (S-3): an average particle diameter of 19 μm, a refraction index of 1.43, a specific gravity of 2.2
(4) Spherical cristobalite: an average particle diameter of 48 μm, a refraction index of 1.54, a specific gravity of 2.3
(5) Spherical aluminosilicate: an average particle diameter of 45 μm, a refraction index of 1.65, a specific gravity of 2.5
(6) Spherical alumina: an average particle diameter of 43 μm, a refraction index of 1.76, a specific gravity of 3.9
(7) Zirconium oxide: an average particle diameter of 38 μm, a refraction index of 2.4, a specific gravity of 6.5
(8) Spherical yttrium oxide $Y_2O_3$: an average particle diameter of 41 μm, a refraction index of 1.82, a specific gravity of 8.6
(9) Lanthanum oxide $La_2O_3$: an average particle diameter of 40 μm, a refraction index of 1.88, a specific gravity of 6.5

Besides, the following components shown in Tables 1 and 2 were used.
(D) Addition Reaction Catalyst
An octyl alcohol modified solution of a chloroplatinic acid (platinum concentration: 2 mass %)
(E) Reaction Inhibitor
A compound represented by the following formula (EMDC)

(F) Releasing Agent
RIKESTER EW 440A (manufactured by Riken Vitamin)
(G) Adhesion Imparting Agent
An adhesion imparting agent represented by the following expression
H-1 wherein j represents 2, h represents 1, s represents 3, t represents 6, and u represents 9.

TABLE 1

|   |   |   | Example No. | | | | | | | |
|---|---|---|---|---|---|---|---|---|---|---|
|   |   |   | 1 | 2 | 3 | 4 | 5 | 6 | 7 | 8 |
| A | Triazine derivative epoxy resin (TEPIC-S) | A1 | 45 | — | — | — | — | — | — | 45 |
|   | Anhydride (RIKACID MH) |   | 55 | — | — | — | — | — | — | 55 |
|   | Silanol group containing silicone resin | A2 | — | 100 | — | 100 | 100 | — | 100 | — |
|   | Vinyl group containing organopolysiloxane | A3-1 | — | — | 93.8 | — | — | 80 | — | — |
|   | Linear organopolysiloxane | A3-2 | — | — | — | — | — | 13.8 | — | — |
|   | Organohydrogenpolysiloxane | A3-3 | — | — | 3.9 | — | — | 6.5 | — | — |
|   |   | A3-4 | — | — | 17.3 | — | — | 13.8 | — | — |
|   | Cured material refraction index of (A) |   | 1.54 | 1.41 | 1.51 | 1.41 | 1.41 | 1.51 | 1.41 | 1.54 |
| B | Titanium oxide (CR-95) |   | 100 | 100 | 116 | 100 | 100 | 100 | 100 | — |
|   | Zinc oxide |   | — | — | — | — | — | — | — | 100 |
|   | Magnesium oxide |   | — | — | — | — | — | — | — | — |
|   | Barium carbonate |   | — | — | — | — | — | — | — | — |
|   | Barium sulfate |   | — | — | — | — | — | — | — | — |
|   | Magnesium silicate |   | — | — | — | — | — | — | — | — |
| C | Fused spherical silica | S-1 | 500 | 500 | 500 | 500 | 400 | 400 | 400 | 500 |
|   |   | S-2 | — | — | — | — | — | — | — | — |
|   |   | S-3 | — | — | — | — | — | — | — | — |
|   | Spherical cristobalite |   | — | — | — | 160 | 105 | — | 105 | — |
|   | Spherical aluminosilicate |   | 360 | — | — | — | 220 | 220 | 350 | 360 |
|   | Spherical alumina |   | — | 530 | 350 | — | 180 | 180 | — | — |
|   | Zirconium oxide |   | — | — | — | — | 200 | — | 290 | — |
|   | Yttrium oxide |   | — | — | 390 | — | — | — | — | — |
|   | Lanthanum oxide |   | — | — | — | 440 | — | — | — | — |
| Others | Triphenyl phosphite |   | 3 | — | — | — | — | — | — | 3 |
|   | 2-ethyl-4-methylimidazole |   | 1 | — | — | — | — | — | — | 1 |
|   | Zinc Benzoate |   | — | 3 | — | 3 | 3 | — | — | — |
|   | Platinum catalyst |   | — | — | 0.1 | — | — | 0.1 | — | — |
|   | RIKESTER EW 440A |   | — | — | 0.7 | — | — | 0.7 | — | — |
|   | KBM403E |   | 0.5 | 0.5 | 0.5 | 0.5 | 0.5 | 0.5 | — | 0.5 |
|   | KBM803 |   | 0.5 | 0.5 | 0.5 | 0.5 | 0.5 | 0.5 | — | 0.5 |
|   | Adhesion imparting agent | H-1 | — | — | 6.2 | — | — | 6.2 | — | — |
|   | Reaction inhibitor (EDMA) |   | — | — | 0.5 | — | — | 0.5 | — | — |

TABLE 2

|   |   |   | Example No. | | | | Comparative example No. | | | |
|---|---|---|---|---|---|---|---|---|---|---|
|   |   |   | 9 | 10 | 11 | 12 | 1 | 2 | 3 | 4 |
| A | Triazine derivative epoxy resin (TEPIC-S) | A1 | 45 | 45 | 45 | 45 | 45 | — | — | 45 |
|   | Anhydride (RIKACID MH) |   | 55 | 55 | 55 | 55 | 55 | — | — | 55 |
|   | Silanol group containing silicone resin | A2 | — | — | — | — | — | 100 | — | — |
|   | Vinyl group containing organopolysiloxane | A3-1 | — | — | — | — | — | — | 93.8 | — |
|   | Linear organopolysiloxane | A3-2 | — | — | — | — | — | — | — | — |
|   | Organohydrogenpolysiloxane | A3-3 | — | — | — | — | — | — | 3.9 | — |
|   |   | A3-4 | — | — | — | — | — | — | 17.3 | — |
|   | Cured material refraction index of (A) |   | 1.54 | 1.54 | 1.54 | 1.54 | 1.54 | 1.41 | 1.51 | 1.54 |
| B | Titanium oxide (CR-95) |   | — | — | — | 100 | 100 | 100 | 116 | 200 |
|   | Zinc oxide |   | — | — | — | — | — | — | — | — |
|   | Magnesium oxide |   | 100 | — | — | — | — | — | — | — |
|   | Barium carbonate |   | — | 100 | — | — | — | — | — | — |
|   | Barium sulfate |   | — | — | 100 | — | — | — | — | — |
|   | Magnesium silicate |   | — | — | — | 100 | — | — | — | — |
| C | Fused spherical silica | S-1 | 500 | 500 | 500 | 320 | — | 500 | — | — |
|   |   | S-2 | — | — | — | — | 800 | 300 | — | 1500 |
|   |   | S-3 | — | — | — | — | — | — | 800 | — |
|   | Spherical cristobalite |   | — | — | — | 84 | — | — | — | — |
|   | Spherical aluminosilicate |   | 360 | 360 | 360 | 280 | — | — | — | — |
|   | Spherical alumina |   | — | — | — | — | — | — | — | — |
|   | Zirconium oxide |   | — | — | — | 232 | — | — | — | — |
|   | Yttrium oxide |   | — | — | — | — | — | — | — | — |
|   | Lanthanum oxide |   | — | — | — | — | — | — | — | — |

TABLE 2-continued

|  |  | Example No. | | | | Comparative example No. | | | |
| --- | --- | --- | --- | --- | --- | --- | --- | --- | --- |
|  |  | 9 | 10 | 11 | 12 | 1 | 2 | 3 | 4 |
| Others | Triphenyl phosphite | 3 | 3 | 3 | 3 | 3 | — | — | 3 |
|  | 2-ethyl-4-methylimidazole | 1 | 1 | 1 | 1 | 1 | — | — | 1 |
|  | Zinc Benzoate | — | — | — | — | — | 3 | — | — |
|  | Platinum catalyst | — | — | — | — | — | — | 0.1 | — |
|  | RIKESTER EW 440A | — | — | — | — | — | — | 0.7 | — |
|  | KBM403E | 0.5 | 0.5 | 0.5 | 0.5 | 0.5 | 0.5 | 0.5 | 0.5 |
|  | KBM803 | 0.5 | 0.5 | 0.5 | 0.5 | 0.5 | 0.5 | 0.5 | 0.5 |
|  | Adhesion imparting agent H-1 | — | — | — | — | — | — | 6.2 | — |
|  | Reaction inhibitor (EDMA) | — | — | — | — | — | — | 0.5 | — |

Examples 1 to 12, Comparative Examples 1 to 4

Based on the composition (parts by mass) shown in each of Table 1 and Table 2, a thermosetting resin, a white pigment, an inorganic filler, as well as an addition reaction catalyst, a reaction inhibitor, a releasing agent, an adhesion imparting agent, a coupling agent (KBM403E (manufactured by Shin-Etsu Chemical Co., Ltd.), KBM803 (manufactured by Shin-Etsu Chemical Co., Ltd.)), and others are blended and kneaded by two rolls, whereby a thermosetting resin composition was obtained. It is to be noted that, as the inorganic filler, each of Examples 1 to 12 includes (C-1) at least one kind of inorganic filler that has an average particle diameter of 30 µm to 100 µm and a refraction index that is different from that of a cured material of the thermosetting resin of the component (A) by 0.05 or above and (C-2) at least one kind of inorganic filler that has an average particle diameter of less than 30 µm. On the other hand, as the inorganic filler, each of Comparative Examples 1 to 4 includes one of (C-1) and (C-2) or neither of them.

The thermosetting resin compositions obtained by Examples 1 to 12 and Comparative Examples 1 to 4 were used, and the following various characteristics were measured. Table 3 shows a result. Molding was performed by using a transfer molding machine under conditions of a molding temperature of 175° C., a molding pressure of 6.9 N/mm², and a molding time of 180 seconds in all examples.

Spiral Flow Value

A die conforming to the EMMI standard was used, and molding was carried out under conditions of a molding temperature of 175° C., a molding pressure of 6.9 N/mm², and a molding time of 120 seconds.

Bending Strength and Bending Elastic Modulus at Room Temperature

A die conforming to the JIS-K6911 standard was used, molding was carried out under conditions of a molding temperature of 175° C., a molding pressure of 6.9 N/mm², and a molding time of 120 seconds, then post-cure was performed at 150° C. for two hours, and bending strength and a bending elastic modulus of each obtained test piece at a room temperature (25° C.) were measured.

Optical Reflectance

Under conditions of a molding temperature of 175° C., a molding pressure of 6.9 N/mm², and a molding time of 120 seconds, each square cured material having each side of 50 mm and a thickness of 0.35 mm was manufactured, and optical reflectance at 450 nm was measured by using X-rite 8200 manufactured by S. D. G. K. K.

Light Leak Test (Optical Transmittance)

As a light leak test, light of 450 nm was applied to a test piece which is the thermosetting resin composition according to each of Examples 1 to 12 and Comparative Examples 1 to 4 molded with a thickness of 300 microns, and an amount of light that has passed through the test piece was measured. Table 3 shows a relative value of each test piece when the optical transmittance of the test piece according to Comparative Example 1 is determined as 1.0. It was confirmed that a leakage rate of light from the test piece using the reflector molded with use of the thermosetting resin composition according to each of Examples 1 to 12 is very smaller than that from the test piece manufactured in each of Comparative Examples 1 to 4.

TABLE 3

| Measurement item | Unit | Example No. | | | | | | | |
| --- | --- | --- | --- | --- | --- | --- | --- | --- | --- |
|  |  | 1 | 2 | 3 | 4 | 5 | 6 | 7 | 8 |
| Spiral flow | cm | 64 | 31 | 25 | 33 | 25 | 33 | 28 | 58 |
| Hardness during hot state | Shore D | 90 | 73 | 70 | 75 | 74 | 72 | 75 | 90 |
| Bending strength | Mpa | 95 | 45 | 47 | 42 | 40 | 45 | 48 | 90 |
| Bending modulus | Mpa | 1600 | 1400 | 1350 | 1280 | 1380 | 1300 | 1410 | 1500 |
| Light transmittance | Relative value | 0.6 | 0.8 | 0.5 | 0.5 | 0.6 | 0.6 | 0.6 | 0.7 |
| Warpage of reflector | µm | 200 | 250 | 250 | 200 | 230 | 210 | 250 | 200 |

TABLE 3-continued

| Measurement | | Example No. | | | | Comparative example No. | | | |
|---|---|---|---|---|---|---|---|---|---|
| item | Unit | 9 | 10 | 11 | 12 | 1 | 2 | 3 | 4 |
| Spiral flow | cm | 60 | 62 | 59 | 75 | 51 | 33 | 38 | 8 |
| Hardness during hot state | Shore D | 90 | 90 | 90 | 88 | 90 | 72 | 70 | 95 |
| Bending strength | Mpa | 92 | 89 | 93 | 85 | 90 | 42 | 45 | Molding impossible |
| Bending modulus | Mpa | 1580 | 1480 | 1570 | 1400 | 1600 | 1380 | 1250 | Molding impossible |
| Light transmittance | Relative value | 0.7 | 0.8 | 0.8 | 0.7 | 1.0 | 1.5 | 1.2 | Molding impossible |
| Warpage of reflector | μm | 200 | 200 | 200 | 250 | 200 | 290 | 280 | Molding impossible |

Example 13

Molding and Physical Properties of Reflector

As shown in FIG. 1(A), a copper lead frame entirely plated with silver was used as a lead frame 5, a matrix type recessed reflector 1 was formed under the following molding conditions by transfer molding with use of the thermosetting resin composition manufactured in each of Examples 1 to 12, and a matrix type recessed reflector board 10 was manufactured (the reflector 1 that has a total of 130 recessed portions each having an opening diameter of 3 mm and a height of 0.3 mm and is 40 mm long and 50 mm wide is formed on a copper plate that is 50 mm long and 55 mm wide). Further, the thermosetting silicone resin composition according to each of Comparative Examples 1 to 4 was used, and the same process was carried out.

Molding conditions are as follows.
A molding temperature: 170° C., a molding pressure: 70 Kg/cm², and molding time: three minutes.

Further, post-cure was effected at 170° C. for two hours.

Each reflector board obtained with use of the thermosetting resin composition according to the present invention has excellent adhesion of the lead frame and the resin composition. Furthermore, warpage of each matrix type reflector board was measured, and Table 3 shows its result. In regard to the warpage of the reflector board, the reflector board subjected to the post-cure was measured from two directions of diagonal lines, and the warpage was represented by an average value.

It was revealed that the warpage of each reflector board obtained with use of the thermosetting resin composition according to the present invention is suppressed.

Then, as shown in FIG. 1, a blue LED device 3 was bonded and fixed to the lead frame 5, which is exposed on the bottom of each recessed portion of the matrix type recessed reflector board 10 manufactured with use of the thermosetting resin composition according to each of Examples 1 to 12, by using a silicone die bonding agent (a product name: LPS-8445S manufactured by Shin-Etsu Chemical Co., Ltd.), and it was electrically connected to the other lead frame 5 through a gold wire 4. Then, a silicone sealant 6 (LPS-5547 manufactured by Shin-Etsu Chemical Co., Ltd.) was injected into each recessed portion in which the LED device 3 is arranged, curing was effected at 120 for one hour, and further effected at 150° C. for one hour, and sealing was thereby performed. Additionally, the thermosetting silicone resin composition according to each of Comparative Examples 1 to 4 was used, and the same process was conducted.

Each matrix type recessed reflector board subjected to the sealing process was diced into each piece, and an LED apparatus was obtained.

Each individual LED device was used, the LED was turned on, and light leakage from a reflector bottom portion was confirmed with naked eyes. A leakage rate of light from each device using the reflector manufactured with use of the composition according to each of Examples 1 to 12 was very smaller than that from each device manufactured in each of Comparative Examples 1 to 4.

Further, the LED device manufactured with use of the composition according to each of Examples 1 to 12 was left in an atmosphere having a temperature of 25° C. and humidity of 80% for 48 hours, and then put into a reflow furnace at 260° C. for three times. Then, adhesion failures between a package surface or an device surface and the sealing resin were checked. A delamination failure was not produced in each apparatus using the reflector molded with use of the thermosetting resin composition (Examples 1 to 12) according to the present invention at all.

It is to be noted that the present invention is not restricted to the foregoing embodiments. The foregoing embodiments are just exemplifications, any examples that have substantially the same structures and the same functions and effects as the technical concept described in claims according to the present invention are included in the technical scope of the present invention.

What is claimed is:

1. A thermosetting resin composition for a reflector of LED, comprising:
   (A) 100 parts by mass of a thermosetting resin;
   (B) 3 to 200 parts by mass of white pigment selected from the group consisting of titanium oxide, zinc oxide, zirconium oxide, magnesium oxide, barium carbonate, magnesium silicate, zinc sulfate, and barium sulfate; and
   (C) 200 to 1300 parts by mass of an inorganic filler other than the component (B), which contains at least the following component (C-1) and the following component (C-2):
      (C-1) 100 to 1000 parts by mass of at least one kind of inorganic filler that has an average particle diameter of 30 μm to 100 μm and a refraction index that is different from a refraction index of a cured material of the thermosetting resin of the component (A) by 0.05 or more; and (C-2) 100 to 800 parts by mass of at least one kind of inorganic filler that has an average particle diameter of less than 30 μm.

2. The thermosetting resin composition for a reflector of LED according to claim 1,
wherein the thermosetting resin of the component (A) is selected from the group consisting of an epoxy resin, a silicone resin, and an epoxy/silicone hybrid resin.

3. The thermosetting resin composition for a reflector of LED according to claim 1,
wherein the inorganic filler of the component (C-1) is selected from the group consisting of cristobalite, aluminosilicate, alumina, and a rare-earth oxide.

4. The thermosetting resin composition for a reflector of LED according to claim 2,
wherein the inorganic filler of the component (C-1) is selected from the group consisting of cristobalite, aluminosilicate, alumina, and a rare-earth oxide.

5. The thermosetting resin composition for a reflector of LED according to claim 1,
wherein at least one of the component (C-1) and the component (C-2) of the component (C) has a spherical shape.

6. The thermosetting resin composition for a reflector of LED according to claim 2,
wherein at least one of the component (C-1) and the component (C-2) of the component (C) has a spherical shape.

7. The thermosetting resin composition for a reflector of LED according to claim 3,
wherein at least one of the component (C-1) and the component (C-2) of the component (C) has a spherical shape.

8. The thermosetting resin composition for a reflector of LED according to claim 4,
wherein at least one of the component (C-1) and the component (C-2) of the component (C) has a spherical shape.

9. The thermosetting resin composition for a reflector of LED according to claim 1,
wherein the thermosetting resin composition for a reflector of LED is cured by condensation reaction or hydrosilylation reaction.

10. The thermosetting resin composition for a reflector of LED according to claim 2,
wherein the thermosetting resin composition for a reflector of LED is cured by condensation reaction or hydrosilylation reaction.

11. The thermosetting resin composition for a reflector of LED according to claim 3,
wherein the thermosetting resin composition for a reflector of LED is cured by condensation reaction or hydrosilylation reaction.

12. The thermosetting resin composition for a reflector of LED according to claim 4,
wherein the thermosetting resin composition for a reflector of LED is cured by condensation reaction or hydrosilylation reaction.

13. The thermosetting resin composition for a reflector of LED according to claim 5,
wherein the thermosetting resin composition for a reflector of LED is cured by condensation reaction or hydrosilylation reaction.

14. The thermosetting resin composition for a reflector of LED according to claim 6,
wherein the thermosetting resin composition for a reflector of LED is cured by condensation reaction or hydrosilylation reaction.

15. The thermosetting resin composition for a reflector of LED according to claim 7,
wherein the thermosetting resin composition for a reflector of LED is cured by condensation reaction or hydrosilylation reaction.

16. The thermosetting resin composition for a reflector of LED according to claim 8,
wherein the thermosetting resin composition for a reflector of LED is cured by condensation reaction or hydrosilylation reaction.

17. A reflector for LED which is obtained by molding using the thermosetting resin composition for the reflector of LED according to claim 1.

18. An optical semiconductor apparatus using the reflector for LED according to claim 17.

* * * * *